United States Patent [19]
Lamm et al.

[11] Patent Number: 5,703,585
[45] Date of Patent: Dec. 30, 1997

[54] HIGH-SPEED MULTIPLEXED DIGITAL-TO-ANALOG CONVERTER

[75] Inventors: Joe Lamm, Alt. Spgs.; Carl Gilbert, St Pete, both of Fla.

[73] Assignee: Tech-Source Inc., Altamonte Springs, Fla.

[21] Appl. No.: 688,848

[22] Filed: Jul. 31, 1996

[51] Int. Cl.$^6$ .................................................. H03M 1/00
[52] U.S. Cl. .......................................... 341/141; 341/144
[58] Field of Search .................................. 341/141, 144; 327/303; 340/825.98

[56] References Cited

U.S. PATENT DOCUMENTS

| | | | |
|---|---|---|---|
| 4,124,845 | 11/1978 | Huntsinger et al. | 340/347 DA |
| 4,150,256 | 4/1979 | Bernet et al. | 179/15 A |
| 5,442,379 | 8/1995 | Bruce et al. | 345/199 |

*Primary Examiner*—Jeffrey A. Gaffin
*Assistant Examiner*—Jason L. W. Kost

[57] ABSTRACT

A high-speed multiplexing technique employs diode bridges to multiplex the outputs of two or more digital-to-analog converters (DACs) together. Like prior art techniques, the diode bridges isolate the DAC outputs from one another and are activated by forward biasing the bridges, one at a time in a staggered-phase, sequential fashion with sequenced biasing currents, to effectively connect the DACs, one at a time to an output signal. Unlike prior art techniques, however, the low capacitance diodes are inserted in series with the sequenced biasing current driving each diode bridge, one on each side of the bridge. The low capacitance diodes are oriented to pass current in the direction of forward bias of the diode bridges. Voltage mode switching is employed to limit the effect of parasitic capacitances on output amplitude. One embodiment is directed to a pair of back-to-back diode bridges driven by a single transformer secondary winding. Other embodiments are directed to transformerless and multiple-transformer implementations.

10 Claims, 3 Drawing Sheets

HIGH-SPEED MULTIPLEXED DIGITAL-TO-ANALOG CONVERTER

TECHNICAL FIELD OF THE INVENTION

The invention relates to computer graphics display systems, more particularly to high-speed digital-to-analog conversion for computer video display, and still more particularly to multiplexing techniques for increasing digital-to-analog conversion speed.

BACKGROUND OF THE INVENTION

Computer-based graphics display systems have steadily been increasing in resolution over the years to the point where extremely high display resolutions are now commonplace. In high-end workstation displays, particularly those used in high-end computer aided design (CAD) and medical imaging applications, resolutions of over 2000×2000 pixels are not uncommon. The resolution of desktop computer display systems now routinely reaches 1024×768 pixels and higher.

These high-resolution display systems place extreme demands on video circuitry, particularly analog-to-digital converters. Whereas many digital problems associated with high-end display systems can be readily solved by increased processing parallelism and wider memory widths (video memories are often arranged with word widths of 64, 128, or even 256 bits) the basic analog problem of displaying pixels on a display screen is a "serial" one, that is, pixels are transmitted to a raster-scan display one at a time. As the number of pixels increases, the rate at which the pixels must be transmitted to the screen increases commensurately. This is compounded by the need for high display refresh rates (e.g., 72 Hz) and non-interlaced display to reduce perceivable flicker and to reduce eyestrain. This requires very rapid conversion of digital pixel information to analog voltages, often at speeds of greater than 300 million conversions per second.

In general, a pixel value represents a color or intensity of a pixel (a dot or "picture element" from which the name pixel derives) on a display screen. Each pixel value must be converted from a stored digital value to an analog representation thereof. On a typical monochrome display, each pixel value consists of a single intensity value. On a typical color display, however, each pixel value comprises three intensity values, one value for each of the three primary colors (red, green and blue). If each intensity value is described by an 8-bit number (fairly common in most modern display systems) then a monochrome display system requires one byte (8 bits) of video memory to describe each pixel while a color display system requires three bytes (24 bits, 8 bits for each primary color) to describe each pixel. On a large display system (e.g., 2000×2000 pixels), a monochrome or pseudo-color display requires a minimum of 4 Megabytes of video memory, while a true color display requires a minimum of 12 Megabytes.

In order to reduce the amount of memory required for color display systems, a color mapping technique is employed. This technique relies on the fact that although a 24-bit pixel can describe over 16 million colors, it is not possible to display all of these colors at once, since there are far fewer than 16 million pixels on even the highest resolution displays. This suggests that a technique which maps numerical pixel index values (e.g., 8-bit, 12-bit or 16-bit values) to 24-bit color values would be useful in reducing the amount of video memory required for a color display system.

This color mapping scheme requires that 24-bit color values be stored in a look-up table (memory). The look-up table is addressed by the numeric pixel index value to select the corresponding 24-bit pixel value, which is then converted (in three separate digital-to-analog converters, one for each primary colors) to analog intensity values for each of the primary colors. This look-up process is performed for every pixel on the display screen. Computer display systems which employ this look-up technique are often referred to as "palettized" display systems, since they operate within a limited "palette" of colors.

Devices known as RAMDACs (Random Access Memory Digital-to-Analog Converters) have become popular for such applications. In these devices, a RAM (Random Access Memory) lookup table is integrated with one or more (often three) digital-to-analog converters. The 24-bit pixel values are stored in the RAM at addresses corresponding to a set of numeric pixel index values. The index values are then presented to the RAMDAC which looks up the appropriate 24-bit pixel value and converts it to one or more corresponding analog voltages. The addition of RAM to the digital-to-analog conversion function, however, consumes a considerable amount of chip area (on the integrated circuit die which implements the integrated RAMDAC function), thus limiting the space available for the conversion function. This limits the ability of RAMDAC producers to manufacture high-speed RAMDACs effectively.

One approach to getting greater pixel-conversion speed out of a RAMDAC based system is to employ several RAMDACs operating in a staggered-phase, multiplexed configuration. It is known in the art to multiplex two or more digital-to-analog converters using diode bridges to increase effective conversion speed.

U.S. Pat. No. 5,442,379 ("BRUCE") shows the basic concept of using diode bridges to multiplex two video DACs. More than two DACs could similarly be multiplexed using appropriately adapted circuitry and control signals. The underlying concept is that two DACs can be operated at half-speed in staggered phase (i.e., each DAC being updated on an opposite phase of the clock signal). The outputs of the two DACs (or RAMDACs) are alternately connected to an output terminal using a pair of diode bridges. The multiplexing technique shown and described in FIG. 7 of BRUCE is substantially reproduced herein as prior-art FIG. 1.

FIG. 1 is a schematic diagram of an analog switching circuit 44 which includes a first diode bridge 73 in parallel connection with a first bypass switch 75 and a second diode bridge 74 in parallel connection with a second bypass switch 76. Bypass switches 75 and 76 are capable of passing high frequency signals when closed, but are not capable of opening and closing at the high pixel switching frequencies necessary to multiplex two video signals together, and are intended primarily to select either one video signal (e.g., R1) or another (e.g., R2) "statically".

A first transformer 71 controls the current flow in the first diode bridge 73. If the anode ("ANODE") of the diode bridge 73 is more positive than the cathode ("CATHODE"), the diode bridge conducts current from its input ("IN") to its output ("OUT"). If the anode of the diode bridge 73 is more negative than the cathode, the diodes in the diode bridge 73 are off, and no current flows from input to output. A second transformer 72 controls the current flow in the second diode bridge 74, in a manner similar to the above-described first transformer 71 and first diode bridge 73.

A buffer amplifier 58 receives a differential video clock signal at terminals 42A and 42B and provides low impedance opposite-phase clocks to drive the first and second transformers 71 and 72. Resistors 61 ... 66 provide balanced loads and termination voltage reference for the buffer amplifier 58 (VTT in FIG. 1 is a termination reference voltage). Resistors 61 ... 66 are each preferably 25 ohms. The buffer amplifier 58 also includes an enable input ("ENABLE") at a terminal 41 for turning off the clock drive, thereby effectively eliminating the low-impedance paths through diode bridges 73 and 74.

In a multiplexing mode, switches 75 and 76 are both opened, and the enable input 41 is activated to provide alternate low-impedance paths through diode bridges 73 and 74, which effectively alternately couples analog input signals "R1" and "R2" to output "R" of the switching circuit 44 at terminal 35.

In BRUCE, the two bridges switch in current mode. In other words, current is permitted to pass through a diode bridge (e.g., 73, 74) when it is forward biased and is prevented from passing through the diode bridge when it is reverse biased. The current output of one DAC (not shown) is applied to the input (e.g., "R1") of the one bridge (e.g., 73) while the current output of another DAC is applied to the input (e.g., "R2") of the other bridge (e.g., 74). The outputs of the two diode bridges are connected together and controlled such that when one bridge conducts (forward biased) the other does not conduct (reverse biased), and vice-versa. By alternately forward-biasing and reverse-biasing two diode bridges with oppositely-phased high-frequency biasing signals (the biasing signals being synchronous with the DAC clocking), the common output ("R") is effectively multiplexed between the two DACs. This provides the capability of updating the output twice as fast as either single one of the DACs can change its output.

One problem with the technique described in BRUCE is the use of signal current-mode bridge switching. This technique yields an output amplitude which reduces with increasing frequency, due primarily to the effect of parasitic capacitances and load capacitances within the circuit. These capacitances tend to "rob" signal current along the signal path, a phenomenon which increases with increasing frequency.

Problems with BRUCE's technique arise from several sources. For example, when the biasing polarity reverses, there is an inrush current which is capable of creating high frequency "spikes" in other areas of the circuit. Further, the diode capacitance provides a leakage path through the non-conducting diode bridge to the output. Another problem has to do with the fact that the transformer secondaries (71, 72, FIG. 1) conduct in only one direction. When a diode bridge is reverse biased, the corresponding transformer secondary is effectively in an open circuit. The transition from conduction to non-conduction presents a varying load to the primary side of the transformer and can produce some measure of inductive "kick".

All of these factors produce irregularities (noise and distortion) in the transformer driving waveform. These irregularities are ultimately seen as output distortion when they are coupled through the other transformer into the opposite (conducting) side of the circuit, or when parasitic capacitances permit leak-through on the non-conducting side of the circuit.

In a monochrome display system, this noise is most likely to manifest itself as thin vertical lines on the display screen. In most color systems, the shadow mask between phosphor dots tends to break up such fine features thereby rendering them invisible to the viewer. Even though the vertical lines may not be noticeable in a color display system, however, the net effect is to add a coherent noise component to pixel values, thereby effectively reducing display contrast.

Further, switching noise can be coupled between the transformer primaries and secondaries by both inductive and capacitive coupling. The varying load and other current noise at the secondary is seen by the primary via inductive coupling. Noise can also be coupled between primary and secondary by inter-winding capacitance.

SUMMARY OF THE INVENTION

It is an object of the present invention to provide a cost-effective, high-quality, high-speed, low-noise multiplexing technique for two or more analog-to-digital converters.

It is a further object of the invention to provide a multiplexing technique for two or more digital-to-analog converters which minimizes switching-induced noise in its output.

It is a further object of the present invention to provide a multiplexing technique for two or more digital-to-analog converters which minimizes or eliminates inductive kick in transformer secondary windings.

It is a further object of the present invention to provide a multiplexing technique for two or more digital-to-analog converters which minimizes or eliminates inductive kick in transformer primary windings.

According to the invention a high-speed multiplexing technique employs diode bridges to multiplex the outputs of two or more digital-to-analog converters (DACs) together.

In a manner similar to prior art techniques, the diode bridges isolate the DAC outputs from one another and are activated by forward biasing the bridges, one at a time in a staggered-phase, sequential fashion with sequenced biasing currents, to effectively connect the DACs, one at a time to an output signal.

According to a feature of the invention, the present inventive technique inserts a pair of low capacitance diodes in series with the sequenced biasing current driving each diode bridge, one on each side of the bridge. The low capacitance diodes are oriented to pass current in the direction of forward bias of the diode bridges.

In one embodiment of the present invention, first two diode bridges are employed to drive second two bridges for the purpose of multiplexing two DACs. A transformer is employed to provide biasing currents to the diode bridges. An oscillating signal is applied to a primary winding of the transformer. A single transformer secondary winding is employed to apply biasing current resulting from the oscillating signal to the two bridges such that when current flows in a first direction in the transformer secondary winding, one of the two bridges is forward biased, and when current flows in the opposite direction in the transformer secondary winding, the other bridge is forward biased. A pair of low-capacitance diodes are inserted in series with the forward-bias current path through each diode bridge, one diode on each side of each bridge. The oscillating signal is set in frequency and phase to synchronize with signals applied to the DACs such that the DACs provide converted (180° out of phase) digital values in an alternating fashion. Each DAC has a voltage-mode output which is used to provide a voltage output from the multiplexing circuit.

According to a feature of the invention, the transformer primary winding leads are driven in both polarities.

Another embodiment of the present invention provides a transformerless technique for multiplexing two DACs by utilizing a pair of amplifiers to provide a biasing signal to each of two or more DACs. The two amplifiers in each pair apply opposite phases of a biasing signal to a diode bridge such that during a "drive" portion of the biasing signal one amplifier provides a positive voltage while the other provides a negative voltage to forward bias the diode bridge, effectively connecting the associated DAC to an output of the multiplexing circuit. During a "disconnect" portion of the biasing signal, the two amplifiers provide opposite polarity biasing voltages to the diode bridge, effectively turning it off and disconnecting its associated DAC from the output of the multiplexing circuit. The DAC output voltage associated with each bridge is added algebraically to the biasing voltage for the bridge. This ensures that the bridge will always conduct when it is "on" and will always disconnect when it is "off", while minimizing the voltage swing on the bridge drive points.

The invention eliminates the undesirable features of the prior art techniques in four principal ways:

The inventive technique employs DACs with voltage outputs driving through a pair of diode bridges to multiplex a voltage output. This requires good quality low-impedance outputs from the DACs, but eliminates the problem of varying output amplitude with frequency.

Further, the inventive technique uses "back-to-back" bridges (i.e., parallel bridges with the second one of the bridges reversed with respect to the first one of the bridges) driven by the same transformer secondary (except in a variation to be described below). This keeps current flowing through the transformer secondary in both directions, effectively eliminating (or at least dramatically reducing) inductive kick and its attendant induced high-frequency noise components.

Still further, the inventive technique employs low-capacitance isolation diodes (see, for example, 252A, B, 254A, B, FIG. 2, described in greater detail hereinbelow) to minimize capacitive coupling through the "off" (non-conducting) bridge to the output.

Additionally, the inventive technique drives both transformer primary wires in both directions. This eliminates inductive "kick" in the primary circuit, thereby reducing noise which might be coupled into the output via the "on" (conducting) bridge.

In an alternative embodiment (FIG. 3) a pair of transformers, driven in opposite phase, are employed to generate the biasing signals for the bridges, but spike suppression diodes are used to prevent inductive kick in the transformer secondaries when the corresponding bridge shifts from conduction to non-conduction. Like the other embodiments, low-capacitance isolation diodes are employed to minimize noise feed-through, and the switching mode is voltage switching, in contrast to the prior art current switching technique.

Other objects features and advantages of the present invention will become evident in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

Figure 1:
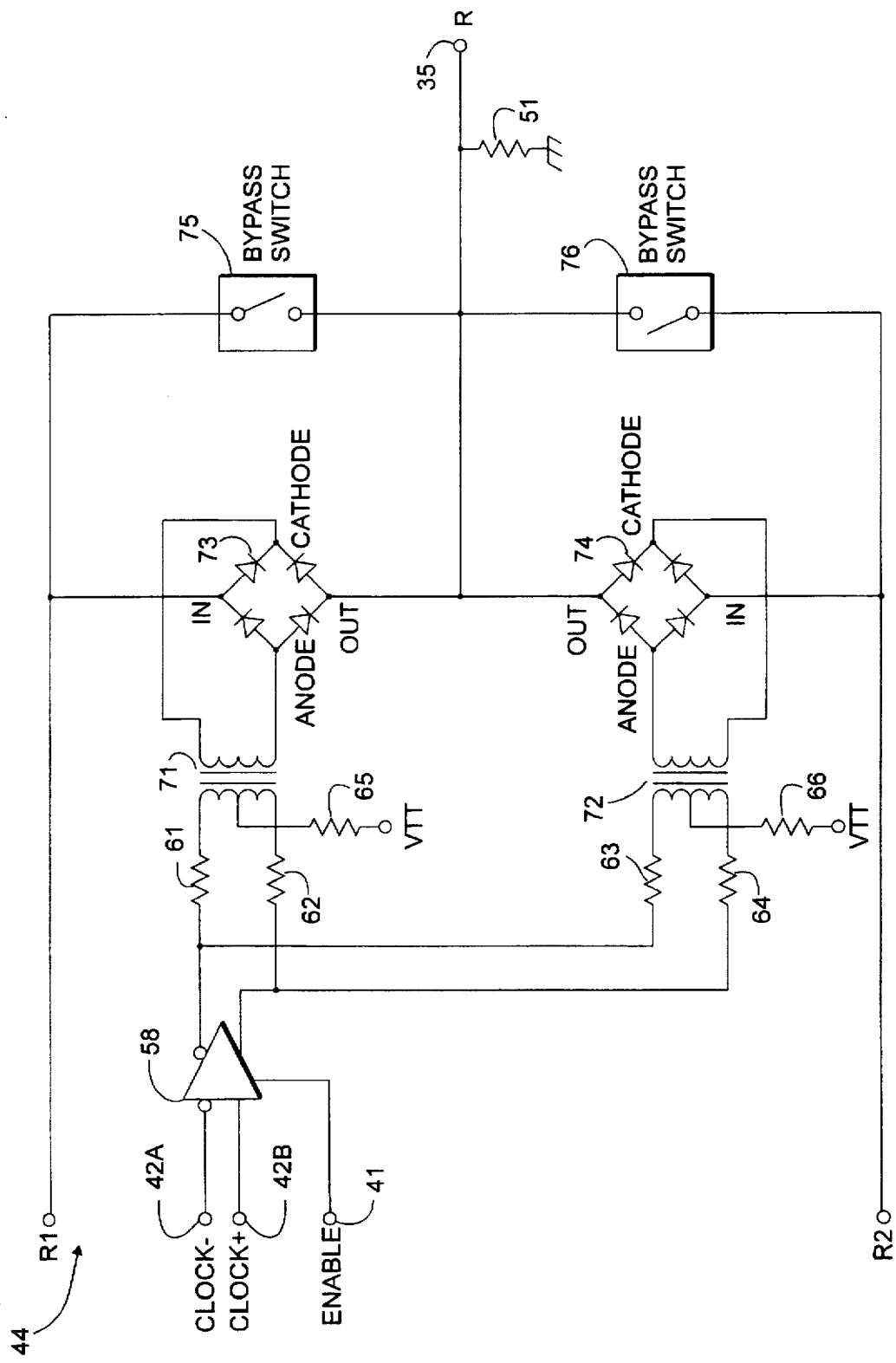
FIG. 1 is a schematic diagram of a prior-art technique for multiplexing two or more video DACs using a pair of diode bridges.

FIG. 1 (Prior Art) has been described hereinabove.

Figure 2:
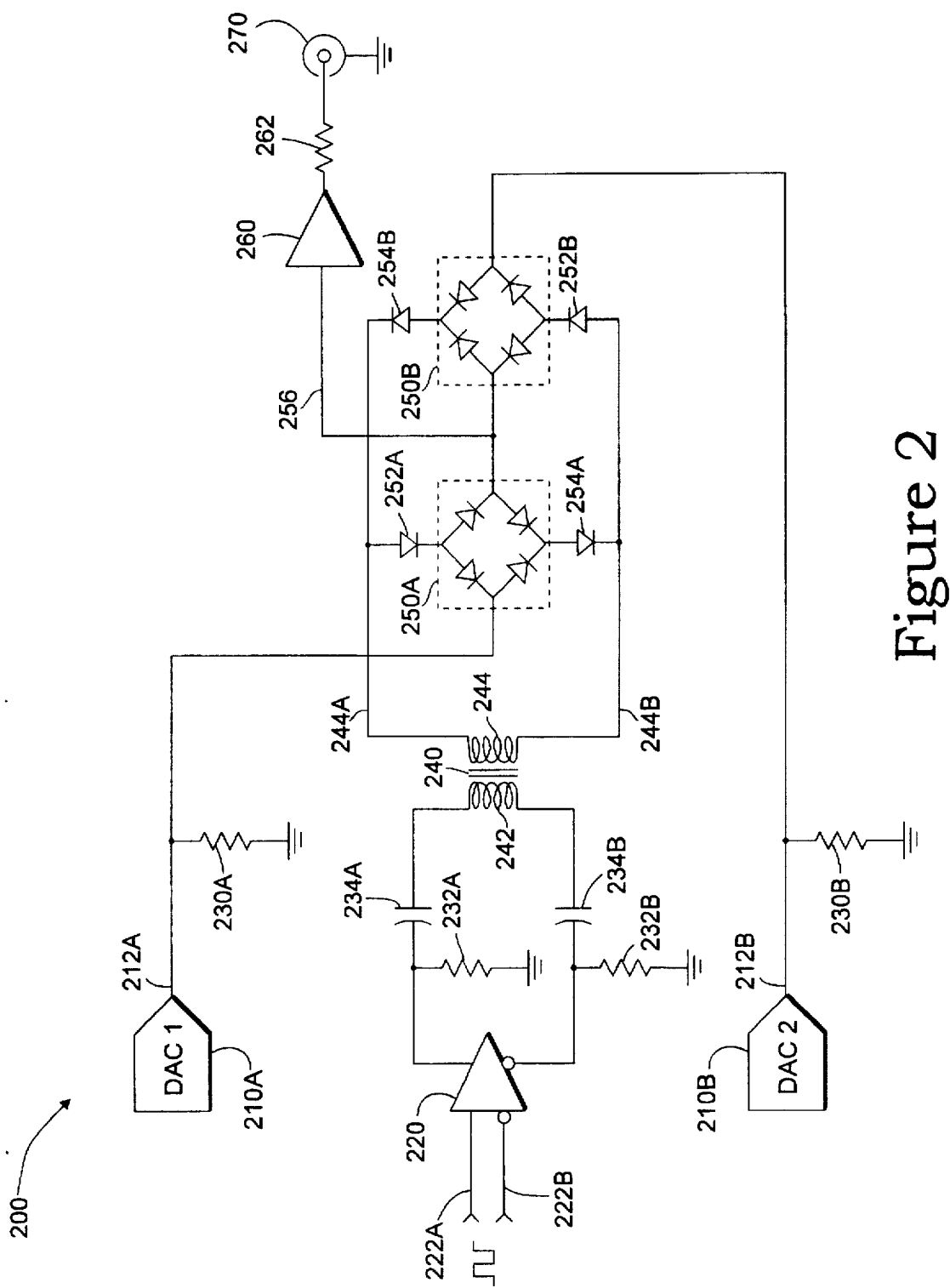
FIG. 2 is a schematic diagram of a high-speed low noise video multiplexer employing transformer-coupled switching, according to the invention.

FIG. 2 is a schematic diagram of a high-speed low noise video multiplexer 200, according to the present invention, wherein the output 212A of a first digital-to-analog converter 210A and the output 212B of a second digital-to-analog converter 210B are multiplexed together to produce a composite output 270. A load resistor 230A is connected between the output 212A of the first digital-to-analog converter 210A and ground. Another load resistor 230B is connected between the output 212B of the second digital-to-analog converter 210B and ground. A driver amplifier 220 has an oscillating switching signal applied across its input leads 222A and 222B. The driver amplifier buffers the switching signal and produces a pair of opposite polarity outputs 224A and 224B (i.e., a pair outputs representative of the switching signal at the input leads 222A and 222B, but one of which is inverted with respect to the other). A load resistor 232A is connected between the output 224A and ground, and another load resistor 232B is connected between output 224B and ground. The output 224A of driver amplifier 220 is connected through a DC-blocking capacitor 234A to one end of a primary winding 242 of a transformer 240. The output 224B is connected through a DC-blocking capacitor 234B to an opposite end of the same transformer primary winding 242. The primary winding 242 of the transformer 240 is thus driven by the outputs 224A and 224B to produce an oscillating switching signal at a secondary winding 244 of the transformer.

A first lead 244A of the secondary winding 244 is connected to an anode end of a low-capacitance diode 252A. A cathode end of the low capacitance diode 252A is connected to an anode terminal (positive drive terminal) of a diode bridge 250A. A cathode terminal (negative drive terminal) of the diode bridge 250A is connected to an anode end of another low-capacitance diode 254A. A cathode end of the low-capacitance diode 254A is connected to a second lead 244B of the secondary winding 244. The output 212A of the first digital-to-analog converter 210A is connected to a signal input terminal of the diode bridge 250A.

The first lead 244A of the secondary winding 244 is connected to a cathode end of a low-capacitance diode 252B. An anode end of the low capacitance diode 252B is connected to a cathode terminal (negative drive terminal) of a diode bridge 250B. An anode terminal (positive drive terminal) of the diode bridge 250B is connected to a cathode end of another low-capacitance diode 254B. An anode end of the low-capacitance diode 254B is connected to the second lead 244B of the secondary winding 244. The output 212B of the second digital-to-analog converter 210B is connected to a signal input terminal of the diode bridge 250B. Signal output terminals of the diode bridges 250A and 250B are commonly connected to an input 256 of a buffer amplifier 260, which buffers the signal at its input 256 and provides it through an impedance matching resistor 262 to an output terminal 270 of the video multiplexer 200.

In the configuration described above, low-capacitance diodes 252A and 254A and the diode bridge 250A are arranged in a series configuration which is forward biased when the polarity of the switching signal at the secondary winding 244 is such that lead 244A is more positive than lead 244B. Low-capacitance diodes 252B and 254B and the diode bridge 250B are arranged in a series combination which is forward biased when lead 244B is more negative than lead 254A. As the polarity of the switching signal at the transformer secondary alternates back and forth, current is conducted alternately through the two diode bridges 250A and 250B. When the lead 244A is more positive than lead 244B, the diode bridge 250A is forward biased and effectively connects the output 212A of the first digital-to-analog converter 210A to the input 256 of the buffer amplifier 260. At the same time, the series combination of low capacitance diodes 252B, 254B and diode bridge 250B is reverse biased, effectively disconnecting the output 212B of the second digital-to-analog converter 210B from the input 256 of the buffer amplifier 260. When the lead 244A is more negative than lead 244B, the diode bridge 250B is forward biased and effectively connects the output 212B of the second digital-to-analog converter 210B to the input 256 of the buffer amplifier 260. In this case, the series combination of low capacitance diodes 252A, 254A and diode bridge 250A is reverse biased, effectively disconnecting the output 212A of the from digital-to-analog converter 210A from the input 256 of the buffer amplifier 260. In this manner, the outputs 212A of the first digital-to-analog converter and 212B of the second digital-to-analog converter 212B are alternately connected to the buffer amplifier 260 at a rate defined by the frequency of the oscillating switching signal at the input leads 222A and 222B of the driver amplifier 220. Each digital-to-analog converter output (212A, 212B) is conducted during one half-cycle of the switching signal such that an output signal at the output terminal 270 changes at twice the frequency of the switching signal. Since the outputs 212A and 212B of the digital-to-analog converters 210A and 210B are connected to the buffer amplifier 260 only half of the time, in alternating, staggered-phase fashion, each digital-to-analog converter needs to be updated only half as often as the rate at which the output 270 changes. This permits, for example, a pixel conversion rate of 500 MHz using two digital-to-analog converters, each operating at pixel conversion rates of only 250 MHz.

The multiplexing technique described above with respect to FIG. 2 differs from prior-art techniques in several ways:

First, diodes (252A, 254A, 252B, 254B) are disposed in series with the diode bridges (250A, 250B). These series diodes, which are preferably low-capacitance diodes, reduces the aforementioned problems with the diode bridges by separating the diode bridges from the transformer secondary and preventing large reverse bias voltages from reaching the diode bridges. This prevents and/or limits the amount of "noise" current produced as the switching polarity (the polarity of the voltage measured between lead 244A and 244B of the secondary winding 244) switches back and forth.

Second, only a single transformer secondary winding (244) is employed to drive both diode bridges (250A, 250B) which are connected in a back-to-back configuration. Since the transformer secondary winding conducts in both polarities, there is no significant inductive "kick" when the switching signal polarity reverses.

Third, both transformer primary leads are driven in both polarities. This is in contrast to the technique used by prior-art techniques (a representative example is shown in FIG. 1) whereby only one half of a center-tapped primary winding is driven during each half-cycle of a switching signal. As each half of the primary winding stops conducting, there is an inductive voltage "kick", which can be coupled into the multiplexed output via capacitive coupling through the transformer and/or diode bridges.

Fourth, the present inventive technique uses the diode bridges to switch voltage outputs of digital-to-analog converters rather than current outputs. The use of voltage switching rather than current switching prevents parasitic capacitance from reducing high-frequency signal amplitude. When current switching is employed, as in the prior art technique, parasitic capacitances (e.g., in the diodes, in wiring, etc.) reduce signal amplitude at higher frequencies.

The embodiment shown and described hereinabove with respect to FIG. 2 employs a transformer to control the switching of a pair of diode bridges. A transformerless embodiment is also possible.

Another alternative transformer-driven embodiment employs two separate bias driver amplifiers and two separate transformers to control biasing currents in two diode bridges for the purpose of multiplexing the outputs of two DACs together. The general characteristics of the present inventive technique are maintained, however. Specifically, these characteristics include isolation of the diode bridges via series-connected low-capacitance diodes, conduction of current in the transformer secondary in both directions, continually driving both leads of the transformer primary, voltage-mode switching as opposed to current mode switching, etc.. This alternative embodiment is shown and described below with respect to FIG. 3.

Figure 3:
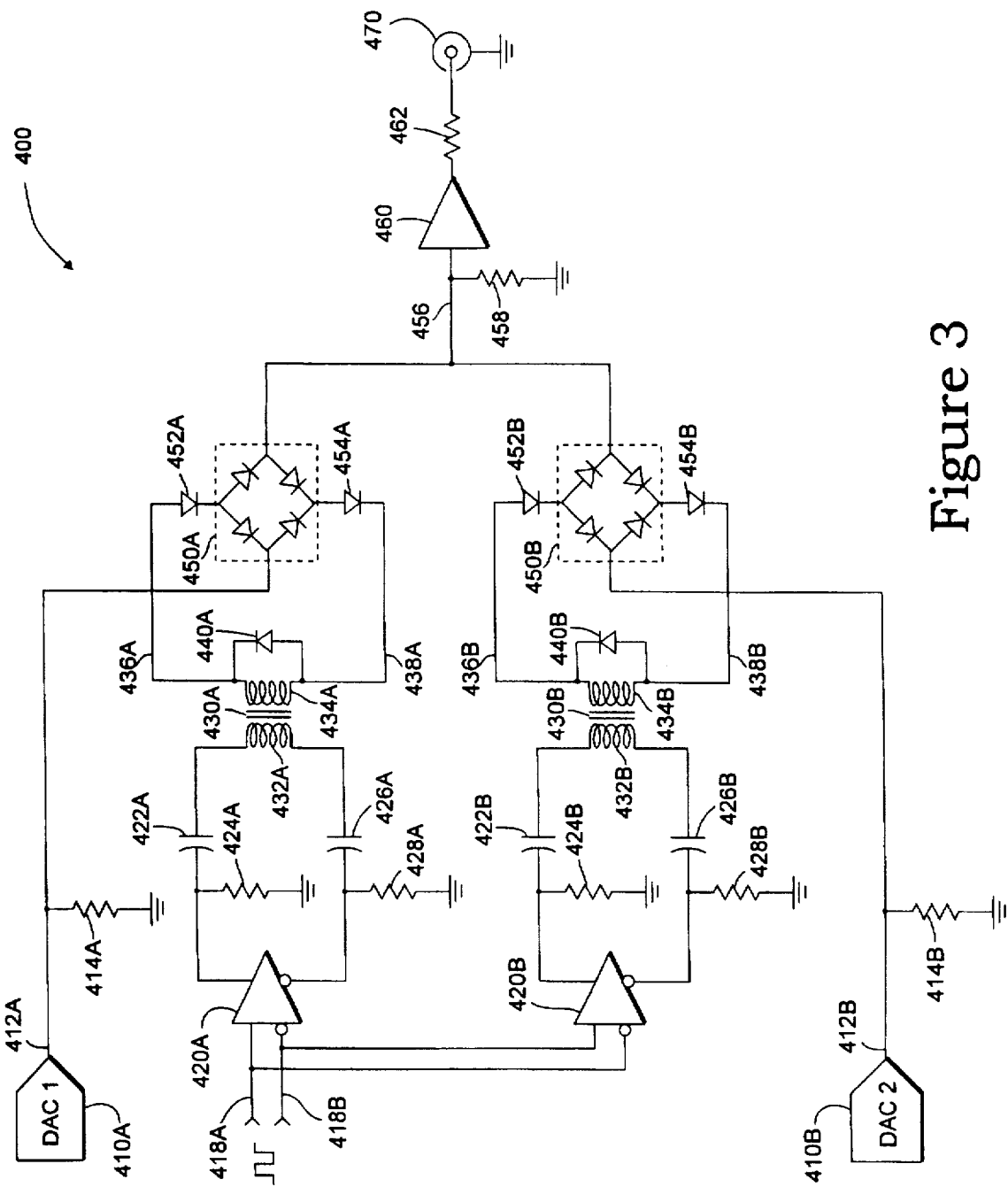
FIG. 3 is a schematic diagram of a high-speed, low-offset video multiplexer, according to the invention.

FIG. 3 is a schematic diagram of a high-speed, low-offset video multiplexer 400, which employs a pair of diode bridges, a first diode bridge 450A and a second diode bridge 450B, to alternately couple outputs 412A and 412B of a pair of DACs 410A and 410B, respectively to an output terminal 470 of the multiplexer 400. The output 412A of the DAC 410A connects to a load resistor 414A and to a signal input of the first diode bridge 450A. The output 412B of the DAC 410B connects to a load resistor 414B and to a signal input of the second diode bridge 450B. Signal outputs of the first diode bridge 450A and the second diode bridge 450B are connected in common to a load resistor 458 and to an input of a buffer amplifier 460. An output of the buffer amplifier connects via an impedance matching resistor to the output terminal 470 of the multiplexer 400.

A first bipolar output driver amplifier 420A drives a primary winding 432A of a first transformer 430A via a resistor capacitor network consisting of resistors 424A and 428A and capacitors 422A and 426A. The capacitors prevent DC current flow through the transformer primary winding 432A. A second bipolar output driver amplifier 420B drives a primary winding 432B of a second transformer 430B via a resistor capacitor network consisting of resistors 424B and 428B and capacitors 422B and 426B.

A first lead 436A of a secondary winding 434A of the first transformer 430A connects to an anode end of a diode 452A (preferably a low-capacitance diode). A cathode end of the diode 452A connects to an anode terminal of the first diode bridge 450A. A second lead 438A of the secondary winding 434A of the first transformer 430A connects to a cathode end of a diode 454A (preferably a low-capacitance diode). An anode end of the diode 454A connects to a cathode terminal of the first diode bridge 450A. A "spike suppression" diode 440A connects between the first lead 436A and the second lead 438A, with the anode end of the diode 440A being connected to the second lead 438A.

A first lead 436B of a secondary winding 434B of the second transformer 430B connects to an anode end of a diode 452B (preferably a low-capacitance diode). A cathode end of the diode 452B connects to an anode terminal of the second diode bridge 450B. A second lead 438B of the secondary winding 434B of the second transformer 430B connects to a cathode end of a diode 454B (preferably a low-capacitance diode). An anode end of the diode 454B connects to a cathode terminal of the second diode bridge 450B. A "spike suppression" diode 440B connects between the first lead 436B and the second lead 438B, with the anode end of the diode 440B being connected to the second lead 438B.

Positive and negative input switching signals 418A and 418B, respectively, are coupled to inputs of the bipolar output driver amplifiers 420A and 420B in opposite polarity such that the outputs of the driver amplifiers 420A and 420B drive in opposite phase (180 degrees from one another). This causes currents in the windings of the two transformers 430A and 430B to flow in opposite directions, thereby forward biasing the first diode bridge 450A while reverse biasing the second diode bridge 450B, and vice versa. When first diode bridge 450A is reverse biased, no current flows through the bridge. The spike suppression diode 440A provides a path for current in the secondary winding 440A in this condition, preventing significant inductive "kick" when the first diode bridge 450A goes from a conducting (forward biased) condition to a non-conducting (reverse biased) condition. The diode 440B performs a similar function with respect to the second diode bridge 450B and the secondary winding 434B.

The embodiment of FIG. 3 has the advantage that complete isolation of the two switching circuits (i.e., separate transformers 450A and 450B and separate driver amplifiers 420A and 420B for the two diode bridges 450A and 450B) completely eliminates cross-coupling of noise to the output terminal by any switching drive or transformer related mechanism. The spike suppression diodes 440A and 440B prevent inductive kick by permitting current to flow in the secondary windings 434A and 434B in both directions. As with the other embodiments (see FIGS. 2 and 3) the series diodes (452A, 454A, 452B, 454B) in series with the diode bridges limit charge storage in the diode bridges (450A, 450B) switching noise coupling through the diode bridges. Voltage-mode switching rather than current mode switching provides full-amplitude output over a wide frequency range, largely unaffected by parasitic capacitances. By way of contrast with prior art techniques, the transformer primary windings are fully driven in both directions (unlike techniques which drive only one half of a center-tapped winding), thereby limiting inductively generated switching noise in the primary circuits.

Although only two diode bridges (450A and 450B) are shown in the multiplexer 400, it will be immediately understood by those of ordinary skill in the art that this technique is readily extended to multiplex three or more DACs by simply adding diode bridges and transformers and extending the biasing scheme to commutate between the diode bridges, thereby coupling the DACs to the output terminal one at a time in serial, staggered-phase fashion. It is fully within the spirit and scope of the present invention to do so.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention.

What is claimed is:

1. A high-speed, low-noise digital-to-analog converter multiplexer, comprising:
    at least two digital-to-analog converters, each digital-to-analog converter having an output, each digital to analog converter output producing a voltage-mode output signal;
    a plurality of diode bridges equal in number to the number of digital-to-analog converters, each diode bridge having an anode terminal, a cathode terminal, a signal input terminal, and a signal output terminal;
    a connection between a signal input terminal of each diode bridge and an output of a respective digital-to-analog converter;
    a common connection between the signal output terminals of the diode bridges, providing a multiplexer output signal;
    at least one bias signal source producing a biasing signal across two opposite polarity outputs thereof; and
    for each diode bridge:
        a first diode connected by a cathode terminal thereof to the common anode terminal of its respective diode bridge and connected by a cathode terminal thereof to an output of a bias signal source; and
        a second diode connected by an anode terminal thereof to the common cathode terminal of its respective diode bridge and connected by an anode terminal thereof to another output of the bias signal source to which the first diode is connected.

2. A high-speed, low-noise digital-to-analog converter multiplexer according to claim 1, further comprising:
    a buffer amplifier connected to the multiplexer output signal to provide a buffered multiplexer output signal.

3. A high-speed, low-noise digital-to-analog converter multiplexer according to claim 1, wherein:
    the first and second diodes connected to each diode bridge are low capacitance diodes.

4. A high-speed, low-noise digital-to-analog converter multiplexer according to claim 1, wherein:
    the number of digital-to-analog converters is two;
    the number of diode bridges is two;
    the number of bias signal sources is one;
    the bias signal source is an oscillating signal source driving a transformer primary winding to produce a bias signal output across a first lead and a second lead of a secondary winding of the transformer;
    a first of the two diode bridges is connected via its respective first and second diodes to the first and second leads of the secondary winding such that the diode bridge is forward biased when the first lead is more positive than the second lead; and
    a second of the two diode bridges is connected via its respective first and second diodes to the first and second leads of the secondary winding such that the diode bridge is forward biased when the second lead is more positive than the first lead.

5. A high-speed, low-noise digital-to-analog converter multiplexer according to claim 4, wherein:
    the transformer primary winding has two outer leads, both of which are continually driven, regardless of oscillating signal polarity.

6. A high-speed, low-noise digital-to-analog converter multiplexer according to claim 1, further comprising:
    bias signal sources equal in number to the diode bridges, wherein each bias signal source further comprises an oscillating signal driving a primary winding of a transformer to provide a bias signal across a first output lead and a second output lead of a secondary winding of the transformer;

connections between the first and second diodes of each diode bridge to the first and second output leads of a respective bias signal source such that the diode bridge is forward biased when the first lead is more positive than the second lead; and for each bias signal source, a spike suppression diode connected across the first output lead and second output lead such that the spike suppression diode is forward biased when the second lead is more positive than the first lead.

7. A high-speed, low-noise digital-to-analog converter multiplexer according to claim 6, wherein:

the oscillating signals driving the bias signal sources provide biasing output signals in serial, staggered-phase fashion, such that the diode bridges are forward biased one at a time in a repeating sequence.

8. A high-speed, low-noise digital-to-analog converter multiplexer according to claim 6, further comprising:

a buffer amplifier connected to the multiplexer output signal to provide a buffered multiplexer output signal.

9. A high-speed, low-noise digital-to-analog converter multiplexer according to claim 1, further:

bias signal sources equal in number to the diode bridges;

each bias signal source further comprises a first amplifier, a second amplifier, a first series resistor and a second series resistor;

each bias signal source, including its first amplifier and second amplifier, being associated with a respective digital-to-analog converter and a respective diode bridge to which the respective digital-to-analog converter is connected;

each first amplifier providing an output equal to the output of its associated digital-to-analog converter plus an oscillating bias signal;

each second amplifier providing an output equal to the output of its associated digital-to-analog converter minus an oscillating bias signal;

the first series resistor of each bias signal source being connected by a first lead thereof to the output of the first amplifier, a second lead of said first series resistor providing a first output of the bias signal source;

the second series resistor of each bias signal source being connected by a first lead thereof to the output of the second amplifier, a second lead of said second series resistor providing a second output of the bias signal source; and connections between the first and second diodes of each diode bridge to the first and second outputs of its associated bias signal source such that the diode bridge is forward biased when the first output is more positive than the second output.

10. A high-speed, low-noise digital-to-analog converter multiplexer according to claim 9, wherein:

the number of digital-to-analog converters is two;

the number of diode bridges is two; and the number of bias signal sources is two.

\* \* \* \* \*